(12) United States Patent
Yoshioka et al.

(10) Patent No.: US 11,948,864 B2
(45) Date of Patent: Apr. 2, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Akira Yoshioka, Yokohama Kanagawa (JP); Hung Hung, Kawasaki Kanagawa (JP); Yasuhiro Isobe, Ota Tokyo (JP); Toru Sugiyama, Musashino Tokyo (JP); Hitoshi Kobayashi, Yamato Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 398 days.

(21) Appl. No.: 17/465,565

(22) Filed: Sep. 2, 2021

(65) Prior Publication Data
US 2022/0310490 A1 Sep. 29, 2022

(30) Foreign Application Priority Data

Mar. 23, 2021 (JP) .................................. 2021-049303

(51) Int. Cl.
*H01L 23/482* (2006.01)
*H01L 29/20* (2006.01)
(Continued)

(52) U.S. Cl.
CPC ...... *H01L 23/4824* (2013.01); *H01L 29/2003* (2013.01); *H01L 29/205* (2013.01); *H01L 29/7786* (2013.01)

(58) Field of Classification Search
CPC .............. H01L 23/4824; H01L 23/528; H01L 23/5283; H01L 9/0653; H01L 9/1066;
(Continued)

(56) References Cited

U.S. PATENT DOCUMENTS

| 8,384,130 B2 | 2/2013 | Jeon et al. |
| 10,204,791 B1 | 2/2019 | Kudymov et al. |

(Continued)

FOREIGN PATENT DOCUMENTS

| JP | 2015133407 A | 7/2015 |
| JP | 5955519 B2 | 7/2016 |

(Continued)

*Primary Examiner* — Fazli Erdem
(74) *Attorney, Agent, or Firm* — Kim & Stewart LLP

(57) ABSTRACT

A semiconductor device has a first wiring extending in a first direction on a nitride semiconductor layer. A source electrode is electrically connected to the first wiring and extends in a second direction. A drain electrode extends in the second direction and includes a first and second portion extending in the second direction, spaced from each other in the first direction. An element isolation region is in the second nitride semiconductor layer between the first and second portions. A third portion extends in the second direction on the first and second portions. A gate electrode extends in the second direction on the second nitride semiconductor layer between the source electrode and the drain electrode. The portion includes holes therein aligned with each other along the second direction with the spacing between adjacent holes in the second direction increasing with increasing distance in the second direction from the first wiring.

20 Claims, 13 Drawing Sheets

(51) Int. Cl.
*H01L 29/205* (2006.01)
*H01L 29/778* (2006.01)

(58) Field of Classification Search
CPC ... H01L 9/2003; H01L 9/205; H01L 9/41725; H01L 9/41775; H01L 9/4236; H01L 9/7786; H01L 9/7787
USPC .......................................................... 257/76
See application file for complete search history.

(56) References Cited

U.S. PATENT DOCUMENTS

2019/0326404 A1* 10/2019 Kumazaki ......... H01L 29/66462
2021/0234042 A1*  7/2021 Xu ...................... H01L 29/7816
2022/0085175 A1*  3/2022 Yoshioka .......... H01L 29/41775

FOREIGN PATENT DOCUMENTS

JP      2019062197 A    4/2019
JP      2019192698 A   10/2019

* cited by examiner

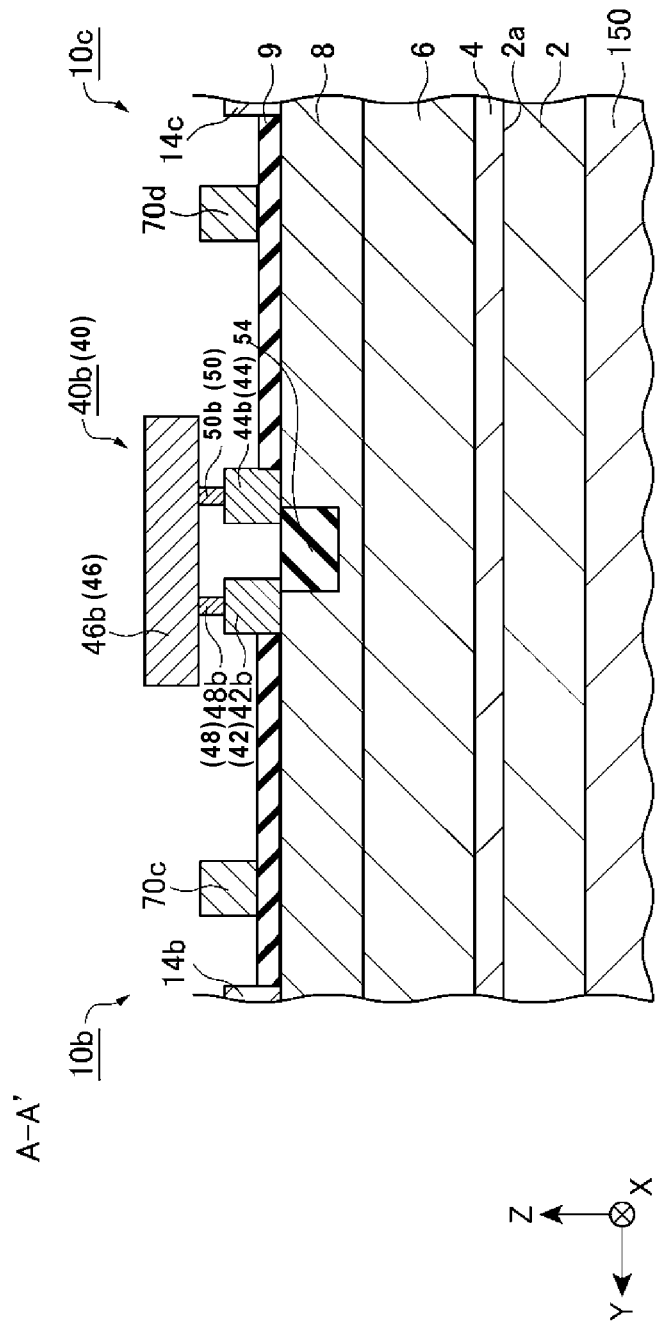

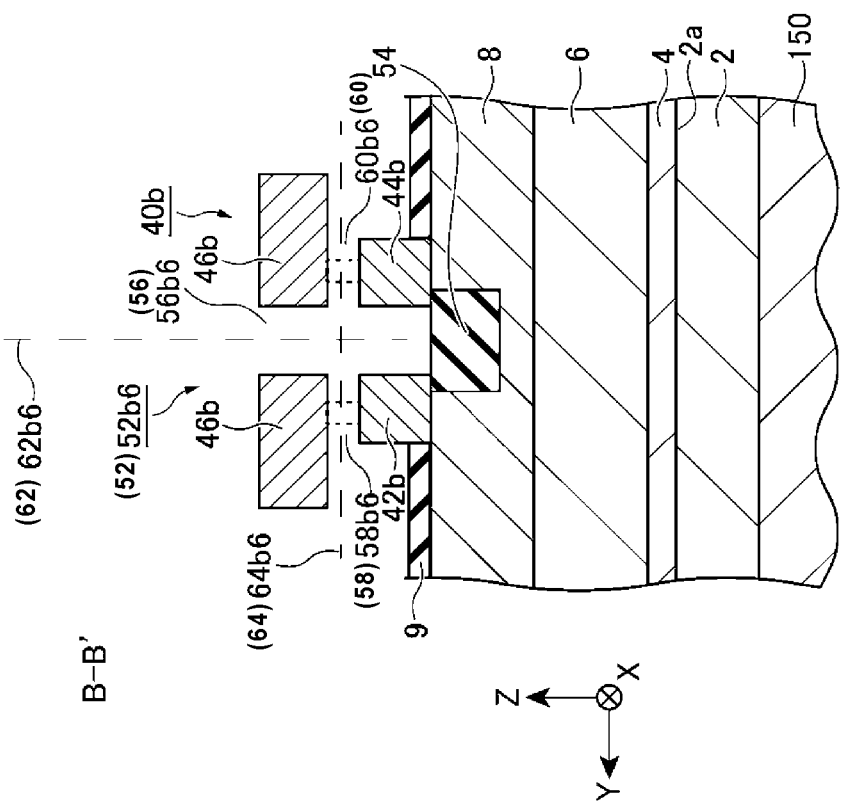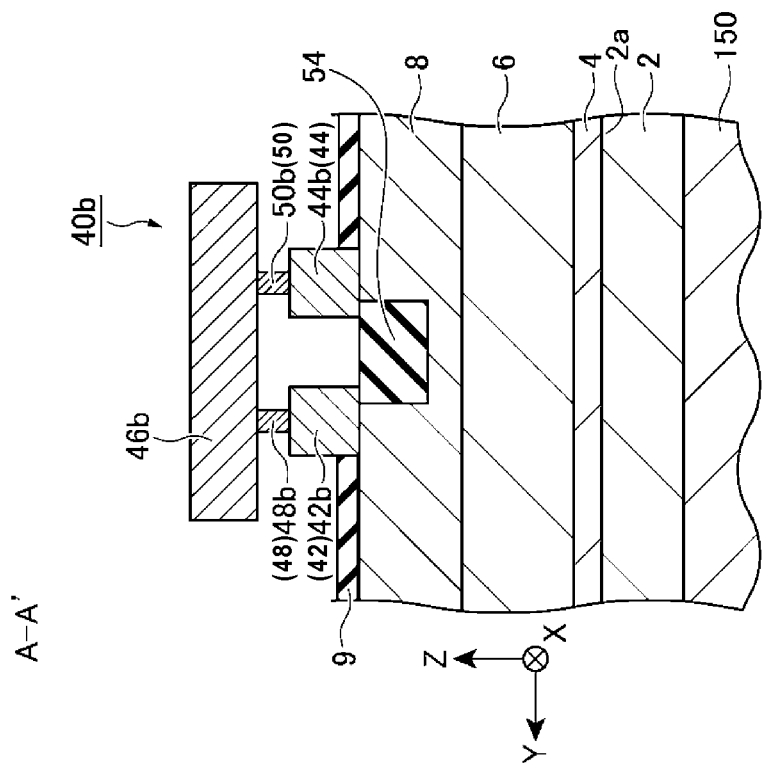

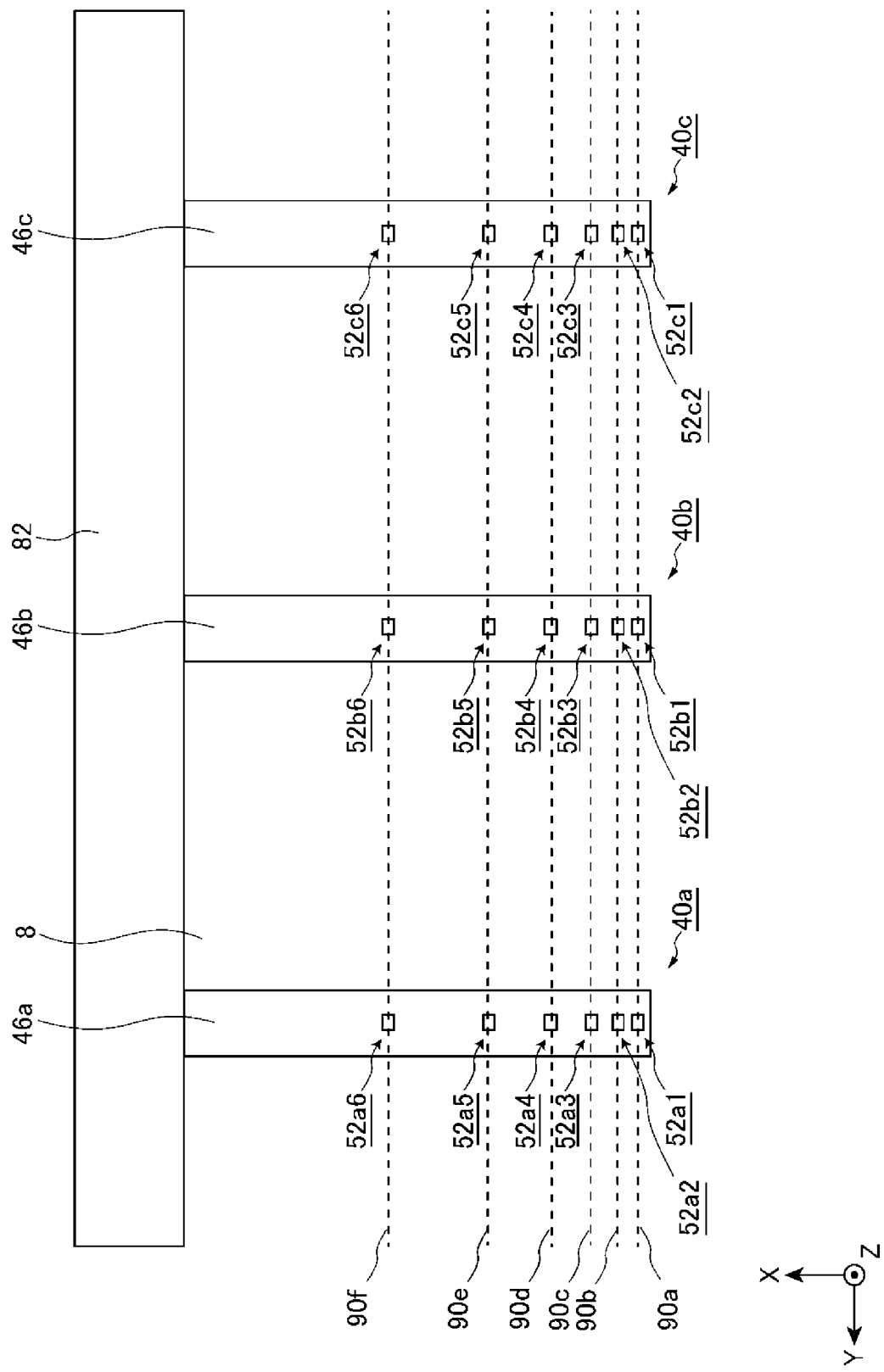

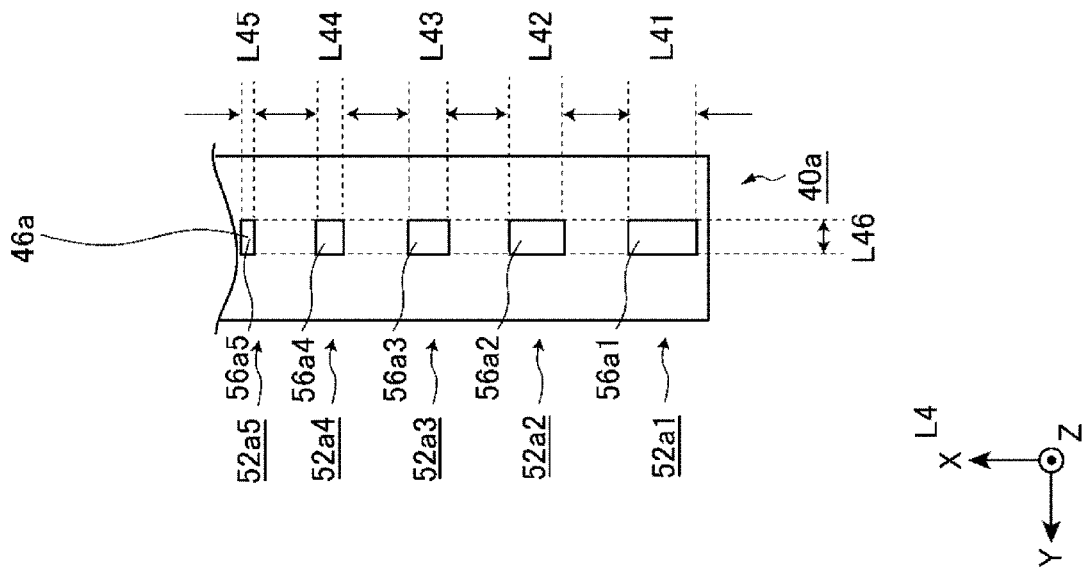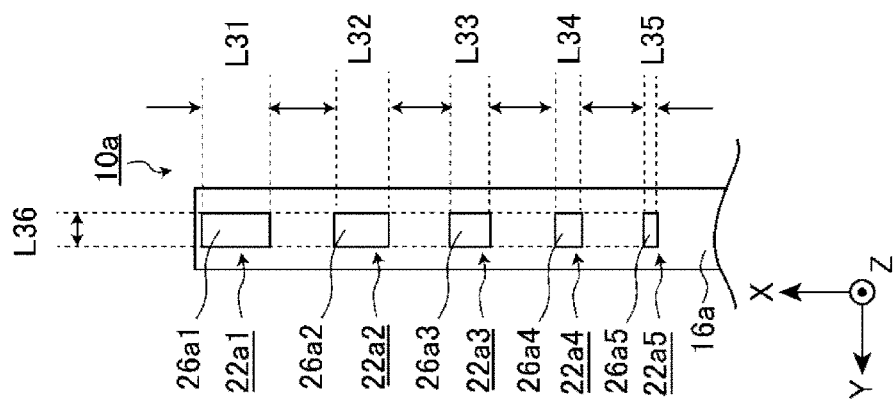

SEMICONDUCTOR DEVICE

CROSS-REFERENCE TO RELATED APPLICATION

This application is based upon and claims the benefit of priority from Japanese Patent Application No. 2021-049303, filed Mar. 23, 2021, the entire contents of which are incorporated herein by reference.

FIELD

Embodiments described herein relate generally to a semiconductor device.

BACKGROUND

A group III nitride semiconductor materials such as, for example, a gallium nitride (GaN) based semiconductors are expected to be used as a material for next generation power semiconductor devices. GaN based semiconductors have a larger band gap than that of silicon (Si) based semiconductors. Therefore, the GaN based semiconductors device can achieve a power semiconductor device having a smaller size and a higher breakdown voltage than those of a silicon semiconductor device.

BRIEF DESCRIPTION OF THE DRAWINGS

FIG. 2 is a schematic cross-sectional view of a semiconductor device of a first embodiment.

FIGS. 3A and 3B are schematic cross-sectional views of a semiconductor device of a first embodiment.

FIG. 6 is a schematic top view of a semiconductor device of a first embodiment.

FIGS. 13A and 13B are schematic top views of a semiconductor device of a third embodiment.

DETAILED DESCRIPTION

Figure 1:
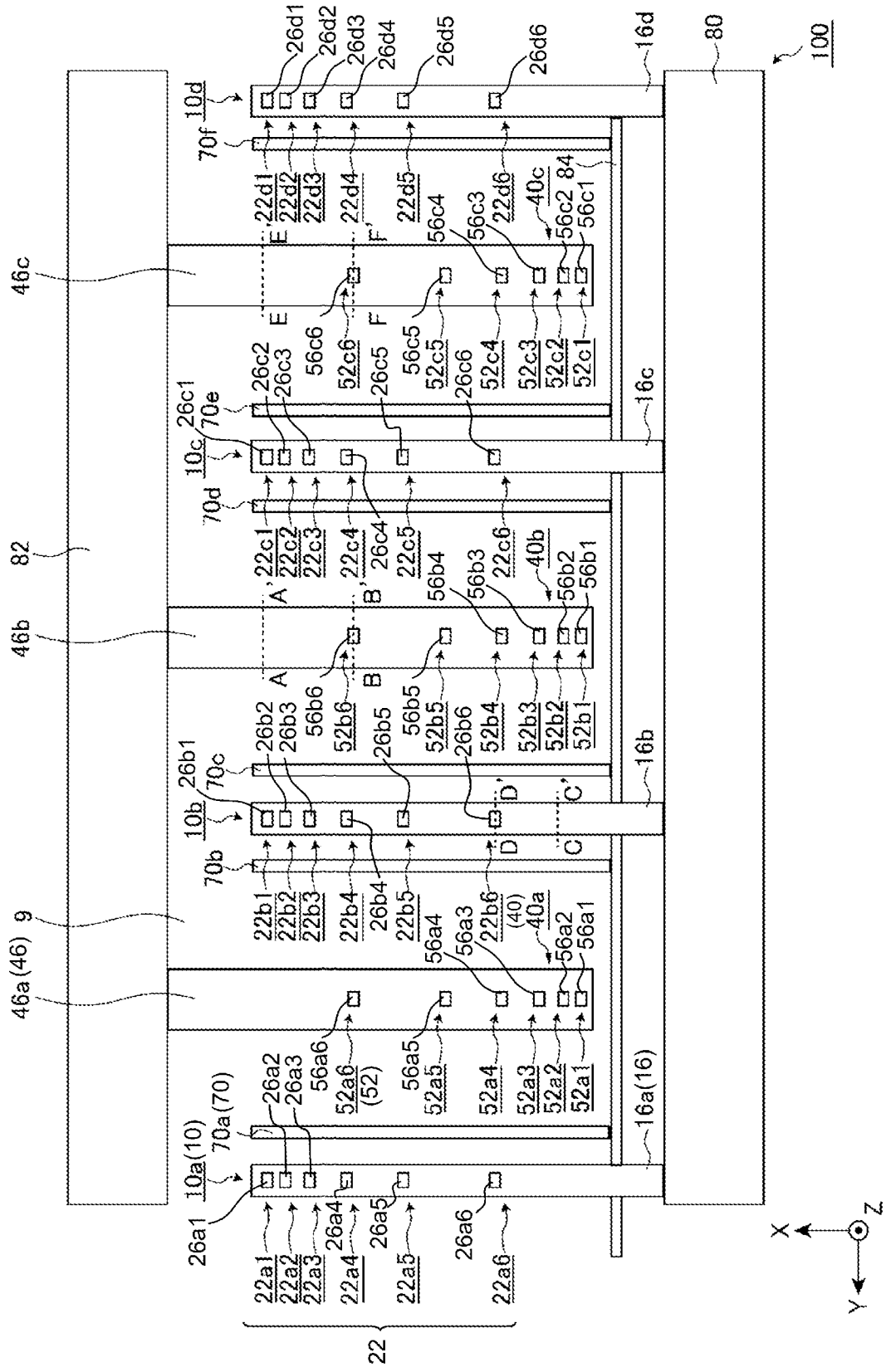
FIG. 1 is a schematic top view of a semiconductor device of a first embodiment.

Embodiments provide a semiconductor device having a reduced output capacitance.

In general, according to one embodiment, a semiconductor device includes a first nitride semiconductor layer on a substrate and a second nitride semiconductor layer on the first nitride semiconductor layer. The second nitride semiconductor layer has a band gap larger than that of the first nitride semiconductor layer. A first wiring is on the second nitride semiconductor layer and extends in a first direction. A first source electrode is on the second nitride semiconductor layer and is electrically connected to the first wiring. The first source electrode extends in a second direction intersecting the first direction. A first drain electrode extends in the second direction. The first drain electrode includes a first drain wiring extending in the second direction on the second nitride semiconductor layer and a second drain wiring extending in the second direction on the second nitride semiconductor layer. The second drain wiring is spaced from the first drain wiring in the first direction. A first element isolation region is in the second nitride semiconductor layer between the positions of the first drain wiring and the second drain wiring. A third drain wiring extends in the second direction on the first drain wiring and the second drain wiring. A first gate electrode extends in the second direction on the second nitride semiconductor layer between the first source electrode and the first drain electrode in the first direction. The third drain wiring includes a plurality of holes therein that are aligned with each other along the second direction with spacing between adjacent holes in the second direction increasing with increasing distance in the second direction from the first wiring.

Hereinafter, certain example embodiments of the present disclosure will be described with reference to the drawings. In the following description, the same or similar aspects or the like may be denoted by the same reference sign. The description of an aspect or the like described once for one example embodiment may be omitted as appropriate from subsequent description of other example embodiments incorporating the same or substantially similar aspects of the like.

In the specification, in order to indicate a positional relationship of a part or the like, an upper direction of the drawing is described as "upper" and a lower direction of the drawing is described as "lower". In the specification, concepts of "upper" and "lower" are not necessarily terms indicating a relationship with the direction of gravity.

First Embodiment

FIG. 1 is a schematic top view of a semiconductor device 100 of the first embodiment. FIG. 2 is a schematic cross-sectional view of the semiconductor device 100 of the first embodiment. FIG. 2 is a schematic cross-sectional view of a drain electrode 40b in a YZ plane at the line A-A' depicted in FIG. 1.

As a substrate 2, a silicon (Si) substrate or a sapphire substrate can be used. As the substrate 2, the silicon substrate is desirably used. The substrate 2 has a substrate surface 2a. The substrate 2 is mounted on, for example, a metal package 150 (FIG. 2).

The first nitride semiconductor layer 6 is, for example, an undoped $Al_XGa_{1-X}N$ ($0 \le X < 1$). More specifically, in this example, the first nitride semiconductor layer 6 is undoped GaN. The first nitride semiconductor layer 6 functions as a channel layer. A film thickness of the first nitride semiconductor layer 6 is, for example, 0.2 μm to 3 μm.

The second nitride semiconductor layer 8 is provided on the first nitride semiconductor layer 6. A band gap of the second nitride semiconductor layer 8 is larger than a band gap of the first nitride semiconductor layer 6. The second nitride semiconductor layer 8 is, for example, undoped $Al_YGa_{a1-Y}N$ ($0 < Y \le 1$, $X < Y$). More specifically, in this example, the second nitride semiconductor layer 8 is undoped $Al_{0.2}Ga_{a0.8}N$. The second nitride semiconductor layer 8 functions as a barrier layer. A film thickness of the second nitride semiconductor layer 8 is, for example, 15 nm to 50 nm.

The third nitride semiconductor layer 4 is provided between the substrate 2 and the first nitride semiconductor layer 6. The third nitride semiconductor layer 4 functions as a buffer layer that alleviates lattice inconsistency (mismatch) with the substrate 2. The third nitride semiconductor layer 4 is formed of, for example, a multilayer structure of aluminum gallium nitride ($Al_W Ga_{1-W} N$ ($0<W<1$)).

The substrate 2, the substrate surface 2a, the third nitride semiconductor layer 4, the first nitride semiconductor layer 6, and the second nitride semiconductor layer 8 are parallel to a plane (XY plane). An interface between the substrate 2 and the third nitride semiconductor layer 4, an interface between the third nitride semiconductor layer 4 and the first nitride semiconductor layer 6, and an interface between the first nitride semiconductor layer 6 and the second nitride semiconductor layer 8 are parallel to the XY plane.

A heterojunction interface is formed between the first nitride semiconductor layer 6 and the second nitride semiconductor layer 8. At the time of an on-operation of the semiconductor device 100, a two-dimensional electron gas (2DEG) is formed at the heterojunction interface and becomes a carrier.

A first wiring 80 (see FIG. 1) is provided on the second nitride semiconductor layer 8. The first wiring 80 extends in the X direction. The first wiring 80 has, for example, a stacked structure of titanium (Ti) and aluminum (Al) or a stacked structure of nickel (Ni) and gold (Au).

A second wiring 82 is provided spaced from the first wiring 80 on the second nitride semiconductor layer 8. The second wiring 82 also extends in the X direction. The second wiring 82 has, for example, a stacked structure of titanium (Ti) and aluminum (Al) or a stacked structure of nickel (Ni) and gold (Au).

A third wiring 84 is provided between the first wiring 80 and the second wiring 82 on the second nitride semiconductor layer 8. The third wiring 84 extends in the X direction. The third wiring 84 has, for example, a stacked structure of titanium (Ti) and aluminum (Al) or a stacked structure of nickel (Ni) and gold (Au).

A source electrode 10 (comprised of a plurality of portions) is provided on the second nitride semiconductor layer 8. The source electrode 10 is electrically connected to the first wiring 80. The source electrode 10 has portions that extend in the Y direction. The source electrode 10 has, for example, a stacked structure of titanium (Ti) and aluminum (Al) or a stacked structure of nickel (Ni) and gold (Au). In FIG. 1, a source electrode 10a, a source electrode 10b, a source electrode 10c, and a source electrode 10d are depicted as portions of the source electrode 10.

A gate electrode 70 (comprised of a plurality of portions) is provided on the second nitride semiconductor layer 8. The gate electrode 70 is electrically connected to the third wiring 84. The gate electrode 70 has portions that extend in the Y direction. FIG. 1 illustrates a gate electrode 70a, a gate electrode 70b, a gate electrode 70c, a gate electrode 70d, a gate electrode 70e, and a gate electrode 70f as portions of the gate electrode 70. Each gate electrode 70 portion is provided between a pair of source electrode 10 portions. The gate electrode 70c is provided between the source electrode 10b and the source electrode 10c. The gate electrode 70d is provided between the source electrode 10c and the gate electrode 70e. The gate electrode 70 has, for example, a stacked structure of titanium (Ti) and aluminum (Al) or a stacked structure of nickel (Ni) and gold (Au).

A drain electrode 40 is provided as plurality of portions on the second nitride semiconductor layer 8. The drain electrode 40 is electrically connected to the second wiring 82. FIG. 1 illustrates a drain electrode 40 having portions referred to as drain electrodes 40a, 40b, and 40c. The drain electrode 40a is provided between the gate electrode 70a and the gate electrode 70b. The drain electrode 40b is provided between the gate electrode 70c and the gate electrode 70d. The drain electrode 40c is provided between the gate electrode 70e and the gate electrode 70f.

The drain electrode 40 includes a plurality of first structures 52 (see FIG. 3B). The arrangement of first structures 52 on drain electrode 40b will be described as representative of the other drain electrode 40 portions. As depicted in FIG. 1, the drain electrode 40b includes a first structure 52b1, a first structure 52b2, a first structure 52b3, a first structure 52b4, a first structure 52b5, and a first structure 52b6. The first structure 52b1 is provided at a tip of the drain electrode 40b, in other words, at a portion of the drain electrode 40b farthest away from the second wiring 82.

Next, the first structure 52b2, the first structure 52b3, the first structure 52b4, the first structure 52b5, and the first structure 52b6 are provided in this order going towards the second wiring 82. The first structure 52b1 to the first structure 52b6 are respectively provided with a first hole 56b1 to a first hole 56b6. That is, the first hole 56b1 is provided in the first structure 52b1, the first hole 56b2 is provided in the first structure 52b2, and the first hole 56b3 is provided in the first structure 52b3. The first hole 56b2 is farther away from a tip of a third drain wiring 46 (46b) than the first hole 56b1, the first hole 56b3 is farther away from the tip of the third drain wiring 46 than the first hole 56b2, and the first hole 56b4 is farther away from the tip of the third drain wiring 46 than the first hole 56b3. The first structure 52b1 to the first structure 52b6 are respectively provided with a first side hole 58b1 to a first side hole 58b6. The first structure 52b1 to the first structure 52b6 are respectively provided with a second side hole 60b1 to a second side hole 60b6.

For example, when the first structure 52b1, the first structure 52b2, the first structure 52b3, the first structure 52b4, the first structure 52b5, and the first structure 52b6 are described as an example, a distance between the first structure 52b2 and the first structure 52b3 in the Y direction is longer than a distance between the first structure 52b1 and the first structure 52b2 in the Y direction. A distance between the first structure 52b3 and the first structure 52b4 in the Y direction is greater than the distance between the first structure 52b2 and the first structure 52b3 in the Y direction. A distance between the first structure 52b4 and the first structure 52b5 in the Y direction is greater than the distance between the first structure 52b3 and the first structure 52b4 in the Y direction. A distance between the first structure 52b5 and the first structure 52b6 in the Y direction is greater than the distance between the first structure 52b4 and the first structure 52b5 in the Y direction. For example, the first structure 52b3 is provided between the first structure 52b1 and the second wiring 82. The first structure 52b2 is provided between the first structure 52b1 and the first structure 52b3. The distance between the first structure 52b2 and the first structure 52b3 is greater than the distance between the first structure 52b2 and the first structure 52b1. In other words, more first structures 52 are provided near the tip of the drain electrode 40 than near the second wiring 82.

The drain electrode 40a similarly includes a first structure 52a1, a first structure 52a2, a first structure 52a3, a first structure 52a4, a first structure 52a5, and a first structure 52a6, arranged in a manner corresponding to the description for drain electrode 40b. Likewise, the drain electrode 40c similarly includes a first structure 52c1, a first structure 52c2, a first structure 52c3, a first structure 52c4, a first structure 52c5, and a first structure 52c6, arranged in a manner corresponding to the description for drain electrode 40b.

The source electrode 10 portions each include a plurality of fifth structures 22. The source electrode 10b will be described as representative of the other portions (10a, 10c, 10d). The source electrode 10b includes a fifth structure 22b1, a fifth structure 22b2, a fifth structure 22b3, a fifth structure 22b4, a fifth structure 22b5, and a fifth structure 22b6 as the fifth structures 22b. The fifth structure 22b1 is provided at a tip of the source electrode 10b, in other words, at a portion of the source electrode 10b farthest away from the first wiring 80. The fifth structure 22b2, the fifth structure 22b3, the fifth structure 22b4, the fifth structure 22b5, and the fifth structure 22b6 are provided in this order going towards the first wiring 80. Second holes 26 (26b1, 26b2, 26b3, 26b4, 26b5, 26b6) are respectively provided in the fifth structures 22b1 to 22b6. That is, the second hole 26b2 is farther away from the tip of the source electrode 10b than the second hole 26b1, and the second hole 26b3 is farther away from the tip of the source electrode 10b than the second hole 26b2. The fifth structures 22b1 to 22b6 are respectively provided with a third side hole 28 (see third side hole 28b6 in FIG. 4B as representative). The fifth structures 22b1 to 22b6 are also respectively provided with a fourth side hole 30 (see fourth side hole 30b6 in FIG. 4B as representative). Second holes 26a1 to 26a6 and fifth structures 22a1 to 22a6 are similarly provided and arranged on the source electrode 10a. Likewise, second holes 26c1 to 26c6 and fifth structures 22c1 to 22c6 on the source electrode 10c and second holes 26d1 to 26d6 and fifth structures 22d1 to 22d6 on the source electrode 10d.

For example, a distance between the fifth structure 22b2 and the fifth structure 22b3 in the Y direction is greater than a distance between the fifth structure 22b1 and the fifth structure 22b2 in the Y direction. A distance between the fifth structure 22b3 and the fifth structure 22b4 in the Y direction is greater than the distance between the fifth structure 22b2 and the fifth structure 22b3 in the Y direction. A distance between the fifth structure 22b4 and the fifth structure 22b5 in the Y direction is greater than the distance between the fifth structure 22b3 and the fifth structure 22b4 in the Y direction. A distance between the fifth structure 22b5 and the fifth structure 22b6 in the Y direction is greater than the distance between the fifth structure 22b4 and the fifth structure 22b5 in the Y direction. For example, the fifth structure 22b3 is provided between the fifth structure 22b1 and the first wiring 80. The fifth structure 22b2 is provided between the fifth structure 22b1 and the fifth structure 22b3. The distance between the fifth structure 22b2 and the fifth structure 22b3 is greater than the distance between the fifth structure 22b2 and the fifth structure 22b1. Similar arrangements with respect to the other fifth structures 22 on source electrodes 10a-10d are also provided. In other words, the fifth structures 22 are provided more closely spaced (bunched) nearer the tip of the source electrode 10 portions.

For example, it is desirable that the distance between the first structure 52b1 and the first structure 52b2 is equal to the distance between the fifth structure 22b1 and the fifth structure 22b2. For example, it is desirable that the distance between the first structure 52b2 and the first structure 52b3 is equal to the distance between the fifth structure 22b2 and the fifth structure 22b3. For example, it is desirable that the distance between the first structure 52b3 and the first structure 52b4 is equal to the distance between the fifth structure 22b3 and the fifth structure 22b4. For example, it is desirable that the distance between the first structure 52b4 and the first structure 52b5 is equal to the distance between the fifth structure 22b4 and the fifth structure 22b5. For example, it is desirable that the distance between the first structure 52b5 and the first structure 52b6 is equal to the distance between the fifth structure 22b5 and the fifth structure 22b6.

A gate insulating film 9 is provided between the second nitride semiconductor layer 8 and the gate electrode 70 between the source electrode 10 portions and the drain electrode 40 portions. The gate insulating film 9 includes, for example, a silicon nitride (SiN) formed by a Plasma Chemical Vapor Deposition (CVD) method, a low-pressure CVD (LPCVD: Low-Pressure Chemical Vapor Deposition) method, or an atomic layer deposition (ALD) method.

FIG. 3A is a schematic cross-sectional view of the drain electrode 40b in the YZ plane in the line A-A' in FIG. 1.

A first drain wiring 42b, which is a portion of a first drain wiring 42, is provided on the second nitride semiconductor layer 8 and extends in the Y direction. A second drain wiring 44b, which is a portion of a second drain wiring 44, is provided on the second nitride semiconductor layer 8 between the gate electrode 70d and the first drain wiring 42b, and extends in the Y direction.

A first element isolation region 54 is provided in the second nitride semiconductor layer 8 below between the first drain wiring 42b and the second drain wiring 44b. The first element isolation region 54 is formed by, for example, implanting Ar (argon) ions into the first nitride semiconductor layer 6 or the second nitride semiconductor layer 8. The first element isolation region 54 may instead be formed by embedding an insulator material such as a polyimide film, a BCB (benzocyclobutene) film, or the like having low relative permittivity in the first nitride semiconductor layer 6 or the second nitride semiconductor layer 8.

A third drain wiring 46b, which is a portion of third drain wiring 46, is provided on the first drain wiring 42b and the second drain wiring 44b, and extends in the Y direction.

A fourth drain wiring 48b, which is a portion of fourth drain wiring 48, is provided between the first drain wiring 42b and the third drain wiring 46b, and extends in the Y direction. The fourth drain wiring 48b electrically connects the first drain wiring 42b and the third drain wiring 46b.

A fifth drain wiring 50b, which is a portion of fifth drain wiring 50, is provided between the second drain wiring 44b and the third drain wiring 46b, and extends in the Y direction. The fifth drain wiring 50b electrically connects the second drain wiring 44b and the third drain wiring 46b.

FIG. 3B is a schematic cross-sectional view of the drain electrode 40b in the YZ plane in the line B-B' in FIG. 1.

As depicted in FIG. 3B, the first structure 52b6 includes the first hole 56b6, the first side hole 58b6, and the second side hole 60b6. The other first structures 52 are similarly structured.

The first hole 56b6 (representative of each first hole 56) penetrates the third drain wiring 46b in the Z direction. The first hole 56b6 is aligned on a first virtual straight line 62b6 parallel to the Z direction.

The first side hole 58b6 (representative of each first side hole 58) penetrates the fourth drain wiring 48b in the Y direction. The first side hole 58b6 is aligned on a second virtual straight line 64b6 parallel to the Y direction. The second virtual straight line 64b6 intersects the first virtual straight line 62*b*6. In other words, a first virtual straight line 62 and a second virtual straight line 64 are provided in the same YZ plane.

The second side hole 60*b*6 (representative of each second side hole 60) penetrates the fifth drain wiring 50*b* in the Y direction. The second side hole 60*b*6 is aligned on the second virtual straight line 64*b*6.

For example, sizes of the first holes 56, the first side holes 58, and the second side holes 60 in each of the first structures 52 are equal to each other. However, the sizes of the first holes 56, the first side holes 58, and the second side holes 60 may be different from each other in some examples.

Figure 4B:
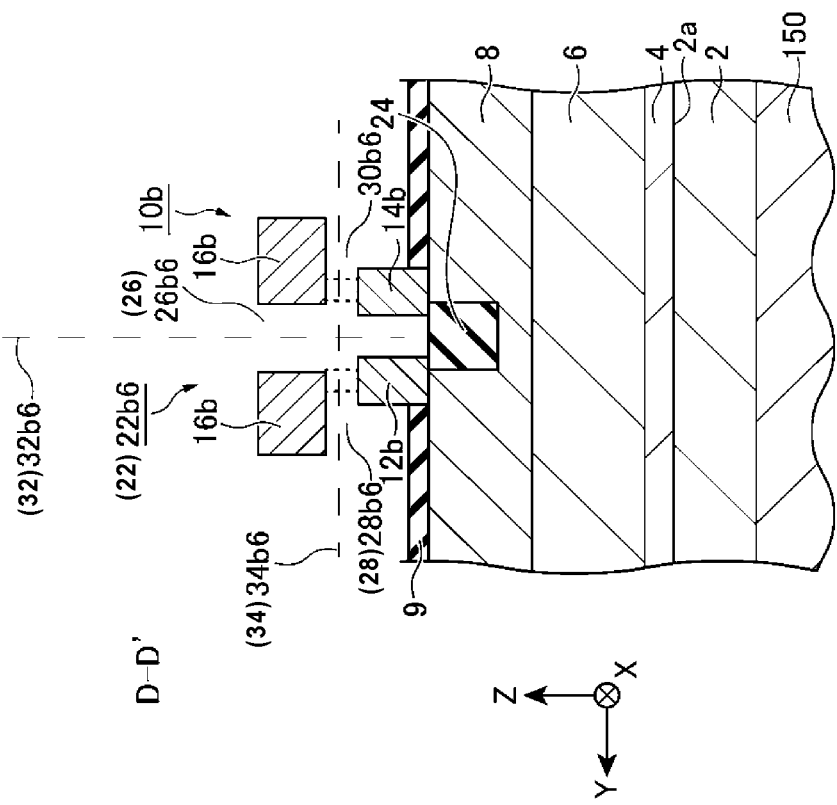
FIGS. 4A and 4B are schematic cross-sectional views of a semiconductor device of a first embodiment.
Figure 4A:
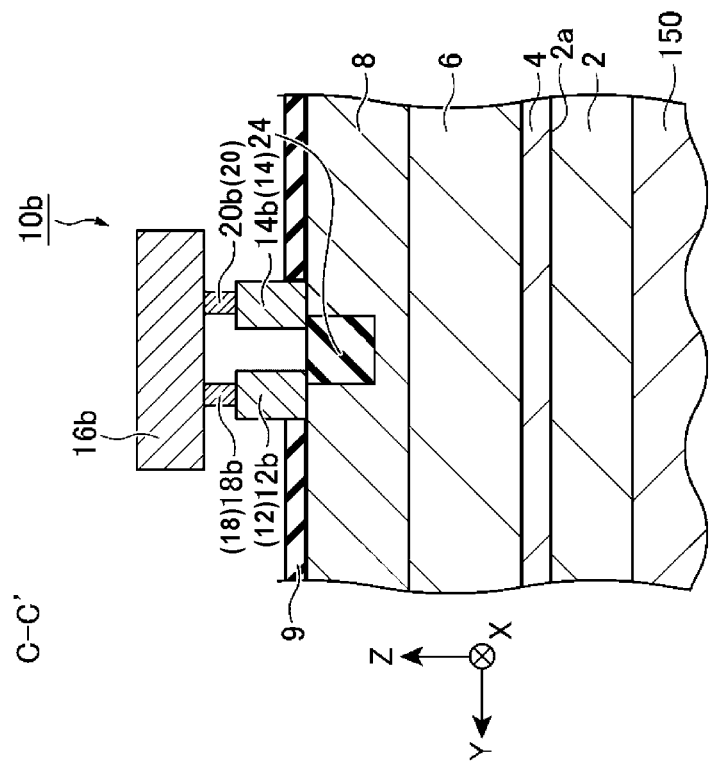

FIG. 4A is a schematic cross-sectional view of the source electrode 10*b* in the YZ plane in the line C-C' in FIG. 1. The cross-section of source electrode 10*b* is representative of the other source electrode 10 portions (10*a*, 10*c*, 10*d*) at similar positions along the X direction.

A first source wiring 12*b*, which is a portion of first source wiring 12, is provided on the second nitride semiconductor layer 8, and extends in the Y direction. A second source wiring 14*b*, which is a portion of second source wiring 14, is provided on the second nitride semiconductor layer 8 between the gate electrode 70*c* and the first source wiring 12*b*, and extends in the Y direction.

A second element isolation region 24 is provided in the second nitride semiconductor layer 8 between positions of the first source wiring 12*b* and the second source wiring 14*b*. The second element isolation region 24 is formed by, for example, implanting Ar (argon) ions into the first nitride semiconductor layer 6 or the second nitride semiconductor layer 8. The second element isolation region 24 may instead be formed by embedding an insulator material such as a polyimide film, a BCB (benzocyclobutene) film, or the like having low relative permittivity in the first nitride semiconductor layer 6 or the second nitride semiconductor layer 8.

A third source wiring 16*b*, which is a portion of third source wiring 16, is provided on the first source wiring 12*b* and the second source wiring 14*b*, and extends in the Y direction.

A fourth source wiring 18*b*, which is a portion of fourth source wiring 18 is provided between the first source wiring 12*b* and the third source wiring 16*b*, and extends in the Y direction. The fourth source wiring 18*b* electrically connects the first source wiring 12*b* and the third source wiring 16*b*.

A fifth source wiring 20*b*, which is a portion of fifth source wiring 20 is provided between the second source wiring 14*b* and the third source wiring 16*b*, and extends in the Y direction. The fifth source wiring 20*b* electrically connects the second source wiring 14*b* and the third source wiring 16*b*.

FIG. 4B is a schematic cross-sectional view of the source electrode 10*b* in the YZ plane at the line D-D' in FIG. 1.

The fifth structure 22*b*6 includes the second hole 26*b*6, the third side hole 28*b*6, and the fourth side hole 30*b*6. The other fifth structures 22 are similarly structured.

The second hole 26*b*6 (representative of each second hole 26) penetrates the third source wiring 16*b* in the Z direction. The second hole 26*b*6 is aligned on a third virtual straight line 32*b*6 parallel to the Z direction.

The third side hole 28*b*6 (representative of each third side hole 28) penetrates the fourth source wiring 18*b* in the Y direction. The third side hole 28*b*6 is aligned on a fourth virtual straight line 34*b*6 parallel to the Y direction. The fourth virtual straight line 34*b*6 intersects the third virtual straight line 32*b*6. In other words, the third virtual straight line 32 and the fourth virtual straight line 34 are provided in the same YZ plane.

The fourth side hole 30*b*6 (representative of each fourth side hole 30) penetrates the fifth source wiring 20*b* in the Y direction. The fourth side hole 30*b*6 is aligned on the fourth virtual straight line 34*b*6.

For example, sizes of the second holes 26, the third side holes 28, and the fourth side holes 30 in each of the fifth structures 22 are equal to each other. However, the sizes of the second holes 26, the third side holes 28, and the fourth side holes 30 may be different from each other.

Figure 5A:
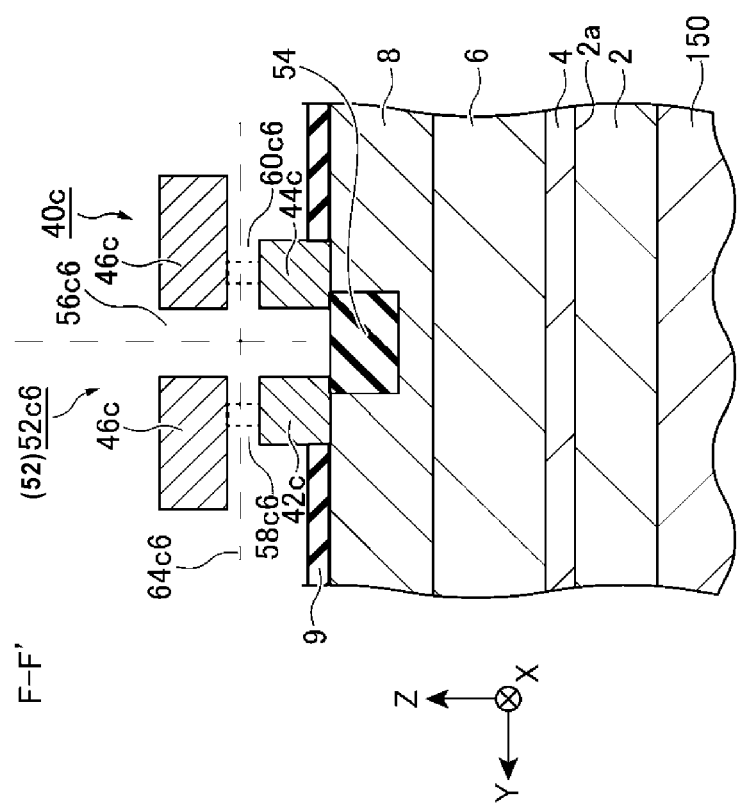
FIGS. 5A and 5B are schematic cross-sectional views of a semiconductor device of a first embodiment.
Figure 5B:
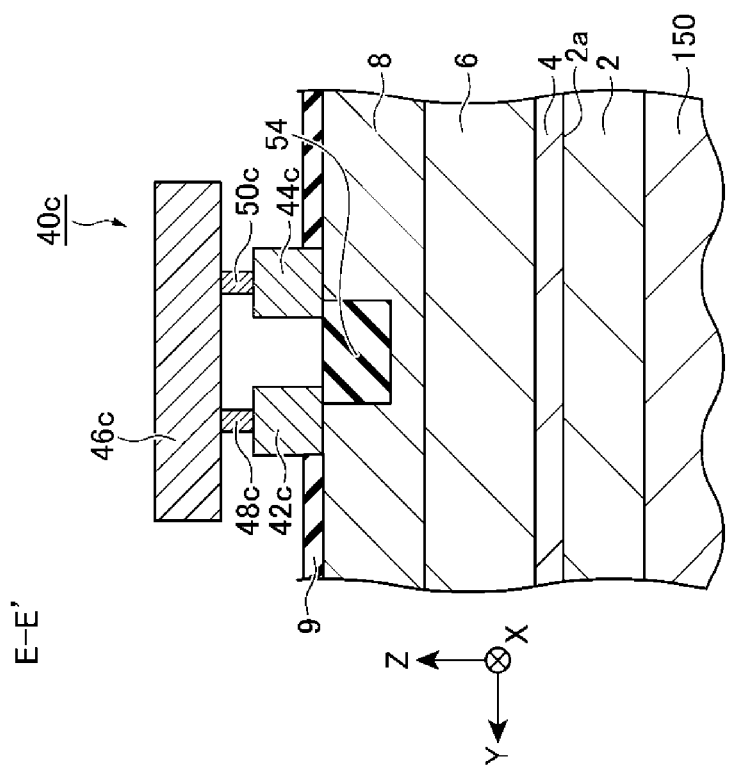

FIGS. 5A and 5B are schematic cross-sectional views of the semiconductor device of the first embodiment.

FIG. 5A is a schematic cross-sectional view of the drain electrode 40*c* in the YZ plane at the line E-E' in FIG. 1. The drain electrode 40*c* is provided on the second nitride semiconductor layer 8 on a side of the source electrode 10*c* opposite to the gate electrode 70*d* (see FIG. 1).

A first drain wiring 42*c*, which is a portion of first drain wiring 42, is provided on the second nitride semiconductor layer 8, and extends in the Y direction. A second drain wiring 44*c*, which is a portion of second drain wiring 44, is provided on the second nitride semiconductor layer 8, and extends in the Y direction. The first drain wiring 42*c* is provided between the second drain wiring 44*c* and the gate electrode 70*d* (see FIG. 1).

The first element isolation region 54 is provided in the second nitride semiconductor layer 8 between positions of the first drain wiring 42 and the second drain wiring 44.

A third drain wiring 46*c*, which is a portion of third drain wiring 46, is provided on the first drain wiring 42*c* and the second drain wiring 44*c*, and extends in the Y direction.

A fourth drain wiring 48*c*, which is a portion of fourth drain wiring 48, is provided between the first drain wiring 42*c* and the third drain wiring 46*c*, and extends in the Y direction. The fourth drain wiring 48*c* electrically connects the first drain wiring 42*c* and the third drain wiring 46*c*.

A fifth drain wiring 50*c*, which is a portion of fifth drain wiring 50, is provided between the second drain wiring 44*c* and the third drain wiring 46*c*, and extends in the Y direction. The fifth drain wiring 50*c* electrically connects the second drain wiring 44*c* and the third drain wiring 46*c*.

FIG. 5B is a schematic cross-sectional view of the drain electrode 40*c* in the YZ plane at the line F-F' in FIG. 1.

The drain electrode 40*c* includes a first structure 52*c*1, a first structure 52*c*2, a first structure 52*c*3, a first structure 52*c*4, a first structure 52*c*5, and a first structure 52*c*6. The first structures 52*c*1-52*c*6 are each respectively provided with a first hole 56. That is, a first hole 56*c*1 is provided in the first structure 52*c*1, a first hole 56*c*2 is provided is provided in the first structure 52*c*2, a first hole 56*c*3 is provided in the first structure 52*c*3, a first hole 56*c*4 is provided in the first structure 53*c*4, a first hole 56*c*5 is provided in the first structure 53*c*5, and a first hole 56*c*6 is provided in the first structure 53*c*6.

The first hole 56 (first hole 56*c*2) in the first structure 52*c*2 is farther away from a tip of the third drain wiring 46*c* than the first hole 56 (first hole 56*c*1) in the first structure 52*c*1. Likewise, the first hole 56 (first hole 56*c*3) in the first structure 52*c*3 is farther away from the tip of the third drain wiring 46*c* than is the first hole 56 (first hole 56*c*2) in the first structure 52*c*2, and so forth for each first hole 56 along the third drain wiring 46*c*. In the present example, the distance between the first hole 56*c*1 in the first structure 52*c*1 and the first hole 56*c*2 in the first structure 52*c*2 is less than the distance between the first hole 56*c*2 in the first structure 52*c*2 and the first hole 56*c*3 in the first structure 52*c*3, and each subsequent pair of adjacent first holes 56 is spaced farther from each other than the pairs closer to the tip of the third drain wiring 46c. Similar arrangements are provided with respect to the first holes 56 (first holes 56a1, 56a2, 56a3, 56a4, 56a5, 56a6) on the third drain wiring 46a and the first holes 56 (first holes 56b1, 56b2, 56b3, 56b4, 56b5, 56b6) on the third drain wiring 46b.

The first structure 52c6 includes a first hole 56c6, a first side hole 58c6, and a second side hole 60c6. The other first structures 52 are similarly structured (see e.g., FIG. 3B).

The first hole 56c6 penetrates the third drain wiring 46c in the Z direction. The first hole 56c6 is aligned on a first virtual straight line 62c6 parallel to the Z direction.

The first side hole 58c6 penetrates the fourth drain wiring 48c in the Y direction. The first side hole 58c6 is aligned on a second virtual straight line 64c6 parallel to the Y direction. The second virtual straight line 64c6 intersects the first virtual straight line 62c6. In other words, the first virtual straight lines 62 and the second virtual straight lines 64 are provided in the same YZ plane.

The second side hole 60c6 penetrates the fifth drain wiring 50c in the Y direction. The second side hole 60c6 is aligned on the second virtual straight line 64c6.

FIG. 6 is a schematic top view of the semiconductor device of the first embodiment. FIG. 6 illustrates the second wiring 82 and the drain electrode 40 also depicted in FIG. 1.

In general, it is desirable that the first structure 52a1, the first structure 52b1, and the first structure 52c1 are aligned on a virtual straight line 90a parallel to the Y direction. Likewise, it is desirable that the first structure 52a2, the first structure 52b2, and the first structure 52c2 are aligned on a virtual straight line 90b parallel to the Y direction. Likewise, it is desirable that the first structure 52a3, the first structure 52b3, and the first structure 52c3 are aligned on a virtual straight line 90c parallel to the Y direction. Likewise, it is desirable that the first structure 52a4, the first structure 52b4, and the first structure 52c4 are aligned on a virtual straight line 90d parallel to the Y direction. Likewise, it is desirable that the first structure 52a5, the first structure 52b5, and the first structure 52c5 are aligned on a virtual straight line 90e parallel to the Y direction. Likewise, it is desirable that the first structure 52a6, the first structure 52b6, and the first structure 52c6 are aligned on a virtual straight line 90f parallel to the Y direction.

Figure 7A:
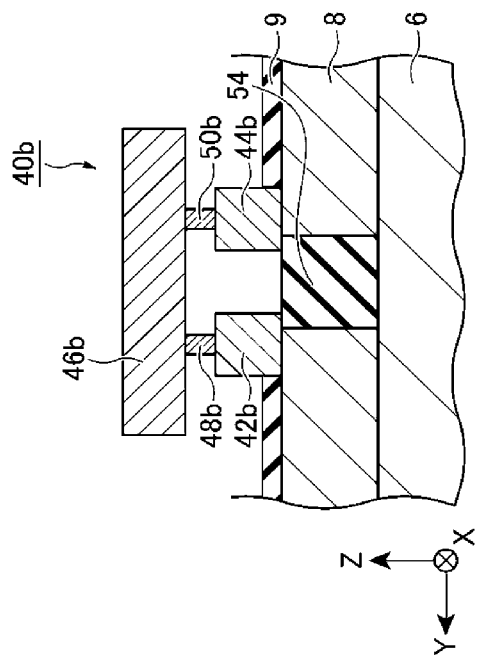
FIGS. 7A to 7C are schematic cross-sectional views of a semiconductor device of a first embodiment.
Figure 7B:
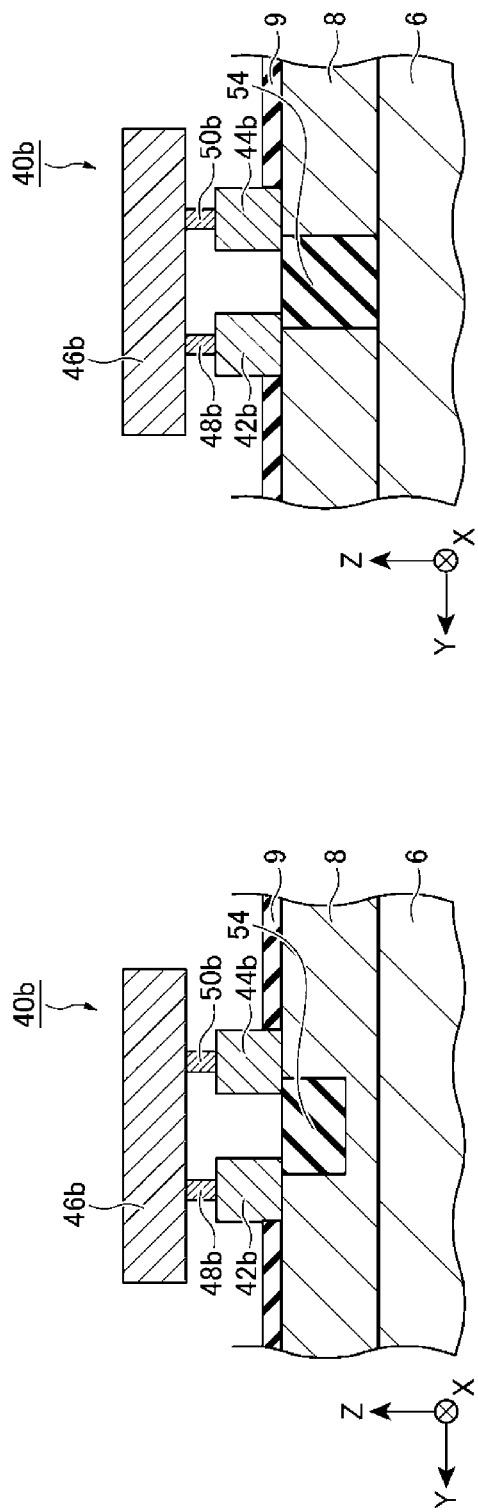
Figure 7C:
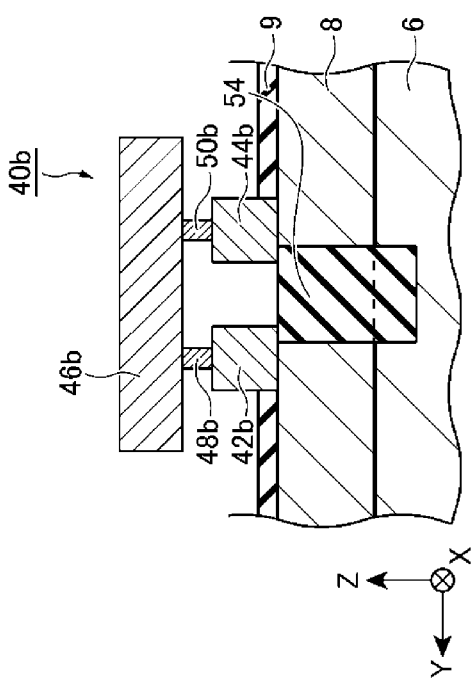

FIGS. 7A to 7C are schematic cross-sectional views of the semiconductor device 100 illustrating certain variations of the first embodiment.

As illustrated in FIG. 7A, the first element isolation region 54 may be provided in the second nitride semiconductor layer 8 without extending into the first nitride semiconductor layer 6. As illustrated in FIG. 7B, the first element isolation region 54 may be in contact with an upper surface of the first nitride semiconductor layer 6. As illustrated in FIG. 7C, a lower part of the first element isolation region 54 may extend into an upper part of the first nitride semiconductor layer 6, and thus may be provided inside the first nitride semiconductor layer 6. The same also variations are also possible for the second element isolation region 24.

The number of the source electrode 10 portions, the drain electrode 40 portions, the gate electrode 70 portions, the first structures 52, and the fifth structures 22 is not limited to the above description.

For example, an interlayer insulating film can be appropriately provided inside and around the source electrode 10, inside and around the drain electrode 40, around the gate electrode 70, around the first wiring 80, around the second wiring 82, and around the third wiring 84 on the gate insulating film 9.

Figure 8:
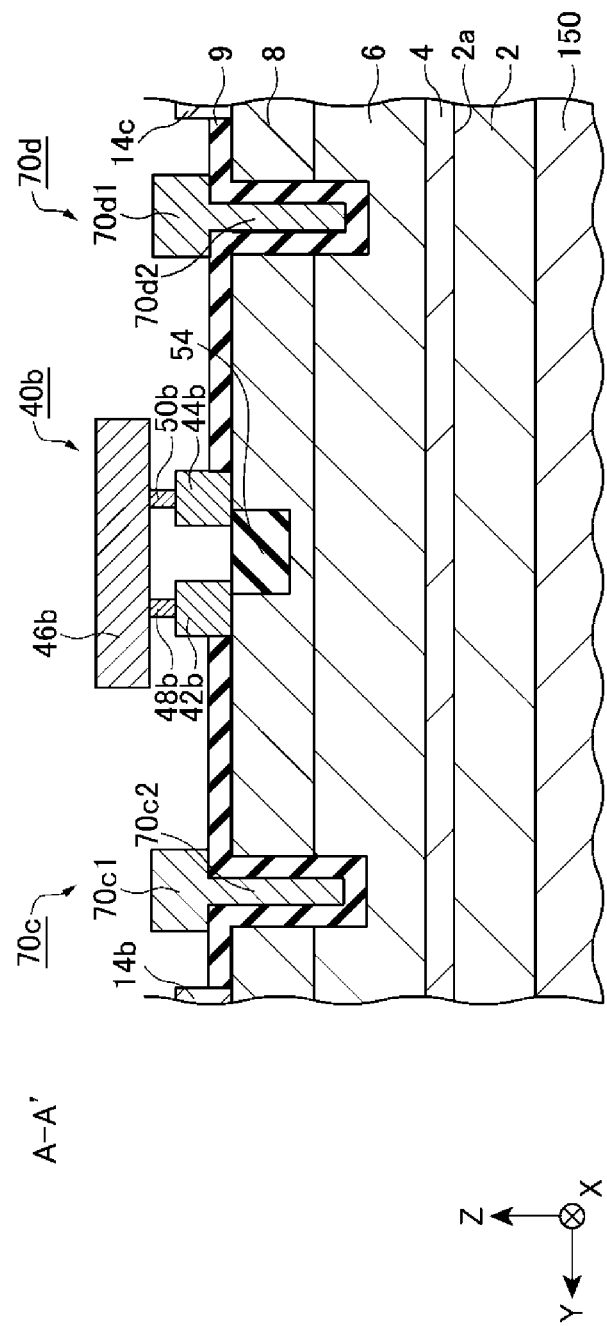
FIG. 8 is a schematic cross-sectional view of a semiconductor device in another example of the first embodiment.

FIG. 8 is a schematic cross-sectional view of a semiconductor device in another example of the first embodiment. The gate electrode 70c includes a first portion 70c1 and a second portion 70c2. The first portion 70c1 is provided on the gate insulating film 9. The second portion 70c2 is provided below the first portion 70c1 and is connected to the first portion 70c1. A lower end of the second portion 70c2 is provided in the first nitride semiconductor layer 6. The gate insulating film 9 is further provided around the second portion 70c2.

Figure 9:
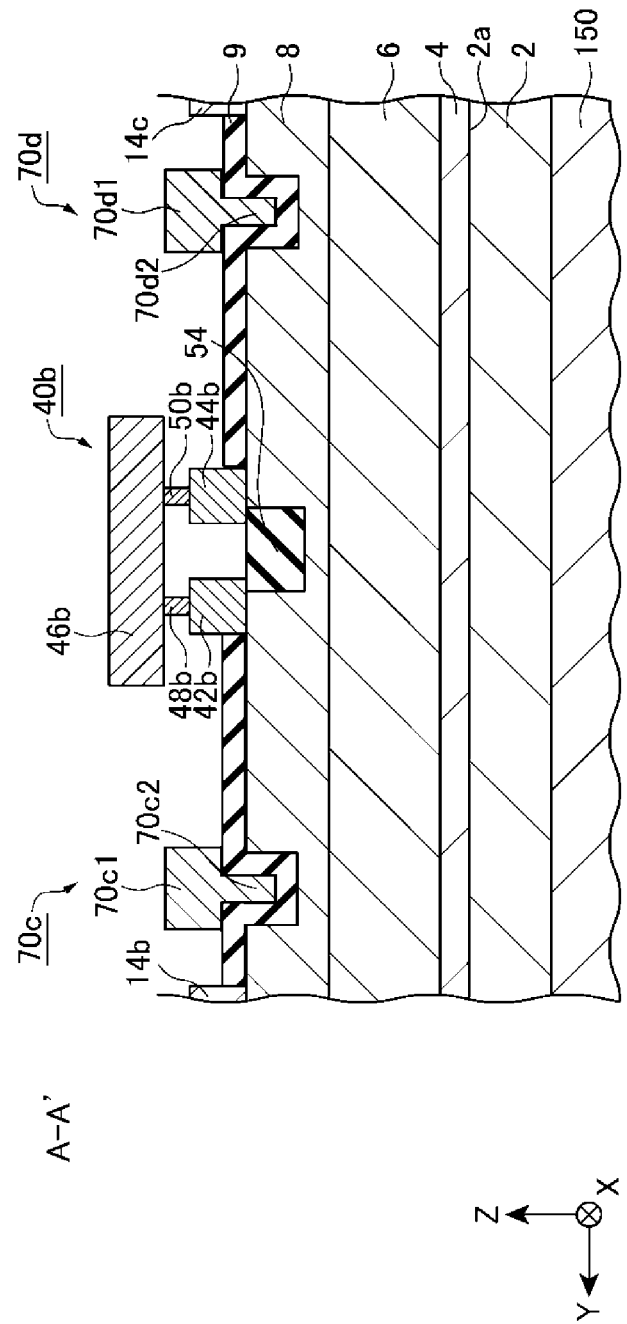
FIG. 9 is a schematic cross-sectional view of a semiconductor device in another example of the first embodiment.

FIG. 9 is a schematic cross-sectional view of a semiconductor device in still another example of the first embodiment. A difference from the semiconductor device illustrated in FIG. 8 is that the lower end of the second portion 70c2 is provided in the second nitride semiconductor layer 8.

Figure 10:
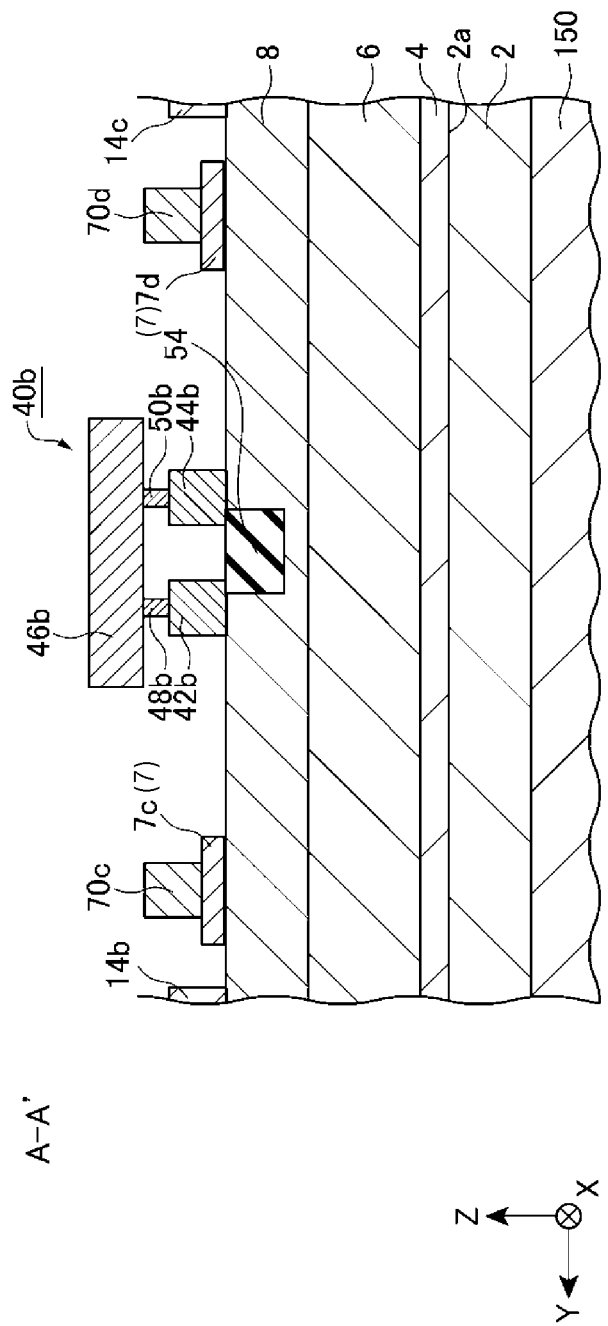
FIG. 10 is a schematic cross-sectional view of a semiconductor device in another example of the first embodiment.

FIG. 10 is a schematic cross-sectional view of a semiconductor device in yet another example of the first embodiment. An electrode 7 portion (7c, 7d) including a nitride semiconductor including a p-type impurity is provided between the second nitride semiconductor layer 8 and the gate electrode 70 portions (70c, 70d).

Any one of the semiconductor devices illustrated in FIGS. 8 to 10 may achieve similar effects and benefits.

Next, operational aspects of semiconductor devices of an embodiment will be described.

The semiconductor devices of an embodiment are expected to be utilized as a high frequency power semiconductor device or the like. However, such semiconductor devices used for such applications generally have a large output capacitance $C_{oss}$. The output capacitance $C_{oss}$ is the sum of a drain-source capacitance $C_{ds}$ and a gate-drain capacitance $C_{gd}$. Here, a capacitance between the substrate 2 and the drain electrode 40 or a capacitance between the package 150 provided below the substrate 2 and the drain electrode 40 significantly contributes to the drain-source capacitance $C_{ds}$. In a high frequency operation, there is a problem that a switching loss caused by charging and discharging the output capacitance $C_{oss}$ becomes large such that it is not possible to provide a semiconductor device providing high breakdown electric field strength and high electron mobility.

When a two-dimensional electron gas is formed at a heterojunction interface below the drain electrode 40, the drain electrode 40 and the two-dimensional electron gas are electrically connected to each other. Therefore, a capacitance between the substrate 2 and the two-dimensional electron gas, or a capacitance component between the package 150 provided under the substrate 2 and the two-dimensional electron gas contributes to the output capacitance $C_{oss}$, thereby causing a problem that the switching loss becomes large.

Output capacitance $C_{oss}$ can be reduced by reducing an area of the drain electrode 40 in the plane parallel to the substrate surface 2a. However, there is a problem that on-resistance of the semiconductor device generally becomes higher with lesser drain electrode 40 area.

The drain electrode 40 of the above-described embodiments includes the first drain wiring 42 and the second drain wiring 44 that are separated from each other. By separating these two wirings in this manner, the area of the drain electrode 40 in contact with the second nitride semiconductor layer 8 becomes smaller, such that the capacitance between the substrate 2 and the drain electrode 40 (or the capacitance between the package 150 and the drain electrode 40) can be reduced.

By providing the first element isolation region 54, concentration of the two-dimensional electron gas formed at the heterojunction interface below between the first drain wiring 42 and the second drain wiring 44 can be reduced. Accordingly, the capacitance between the substrate 2 and the two-dimensional electron gas (or the capacitance between the package 150 and the two-dimensional electron gas) can be reduced.

The drain electrode 40 of the above-described embodiments also includes a plurality of first structures 52. Each of the first structures 52 includes the first hole 56 that penetrates through the third drain wiring 46 in the Z direction, a first side hole 58 that penetrates the fourth drain wiring 48 in the Y direction, and a second side hole 60 that penetrates the fifth drain wiring 50 in the Y direction.

By providing the first hole 56 in this manner, the area of the wiring forming the drain electrode 40 is further reduced, such that the capacitance between the substrate 2 and the drain electrode 40 (or the capacitance between the package 150 and the drain electrode 40) can be reduced. In the first embodiment, since the first side hole 58 and the second side hole 60 are provided in addition to the first hole 56, an effect of reducing the capacitance component can be further improved.

By providing first structures 52, the capacitance between the substrate 2 and the drain electrode 40 (or the capacitance component between the package 150 and the drain electrode 40) can be reduced. On the other hand, as noted, there can be a problem that the resistance of the smaller area drain electrode 40 increases and thus the on-resistance of the semiconductor device 100 increases. Therefore, in the semiconductor device 100 of the first embodiment, first structures 52 are provided in greater density (shorted spacing) near the tip of the drain electrode 40. Since the tip of the drain electrode 40 is a portion farthest away from the second wiring 82, current density current becomes smaller. Therefore, even though the resistance increases by providing the first structures 52, the effect on the on-resistance semiconductor device 100 can be reduced. As a result, the capacitance between the substrate 2 and the drain electrode 40 (or the capacitance component between the package 150 and the drain electrode 40) can be reduced while minimizing the increase in the on-resistance.

Figure 11A:
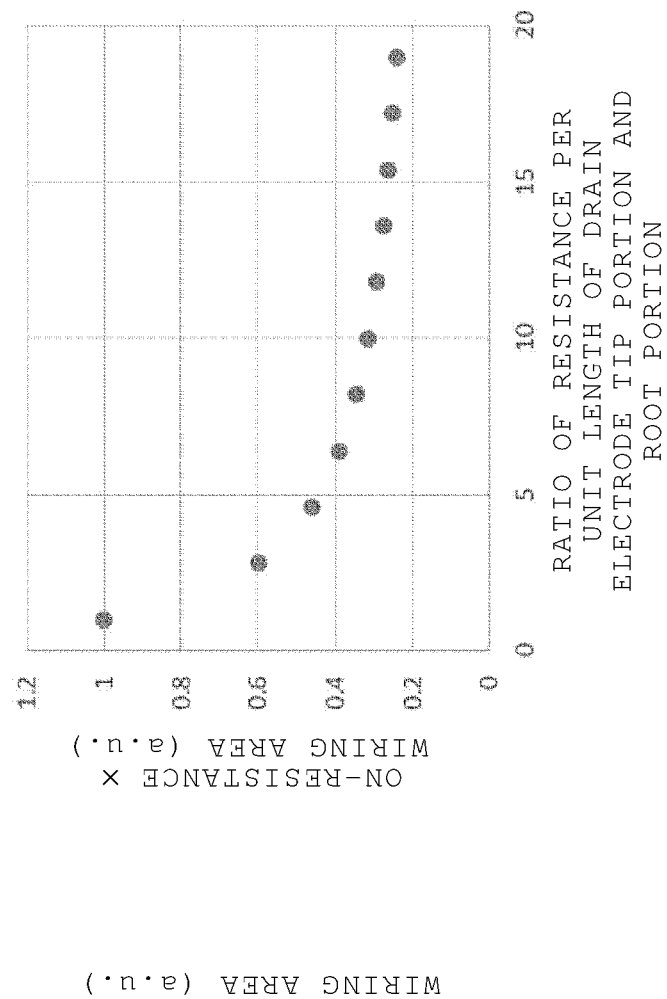
FIGS. 11A and 11B are graphs illustrating an action effect for a semiconductor device of a first embodiment.
Figure 11B:
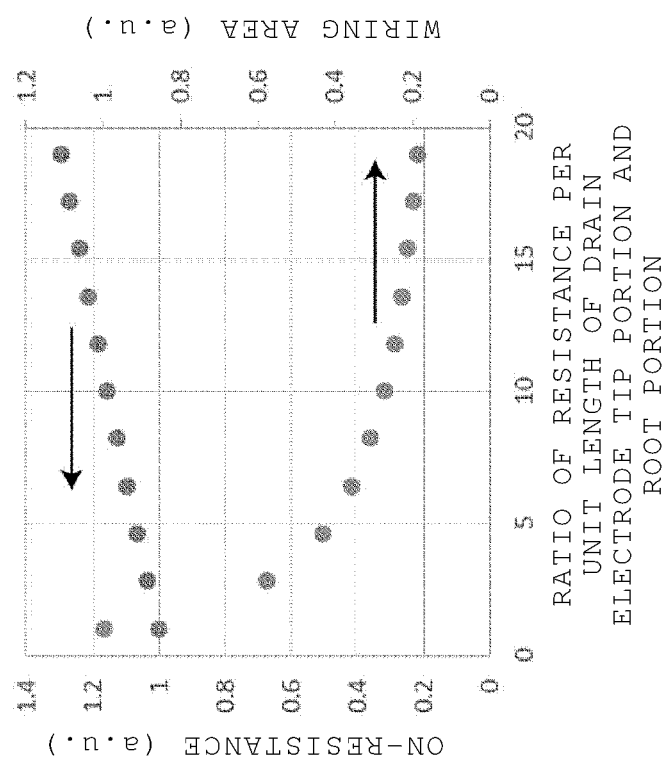

FIGS. 11A and 11B are graphs for illustrating characteristics of semiconductor devices 100 of the first embodiment. A vertical axis of the graph in FIG. 11A shows the on-resistance (left axis) and the wiring area (right axis). Both vertical axes are in arbitrary units ("a.u."). In this context, "wiring area" is the area of the drain electrode 40 in the plane parallel to the substrate surface 2a. The horizontal axis of the graph of FIG. 11A reflects the ratio of wiring resistance per unit length of the drain electrode 40 along the Y direction, which is a ratio between the tip of the drain electrode 40 (the portion farthest away from the second wiring 82) and a root portion of the drain electrode (a portion closest to the second wiring 82). As the ratio gets larger, a larger number of first structures 52 are provided in the drain electrode 40. As illustrated in FIG. 11A, as the ratio becomes larger, the on-resistance of the semiconductor device 100 becomes larger as the wiring area becomes smaller.

A vertical axis of the graph of FIG. 11B shows the product (multiplication) of the on-resistance and the wiring area. In order to reduce the output capacitance $C_{oss}$, it is considered to reduce the size of semiconductor device 100. However, when the semiconductor device 100 is reduced in size, the on-resistance increases. Therefore, the product of the on-resistance and the output capacitance $C_{oss}$ is important as a performance index (figure of merit (FOM)) for the semiconductor device 100. Here, on the assumption that the output capacitance $C_{oss}$ is proportional to the area of the drain electrode 40, the product of the on-resistance and the wiring area is a particularly important figure of merit (FOM) of the semiconductor device 100. A horizontal axis of the graph of FIG. 11B reflects the ratio of the wiring resistance per unit length of the drain electrode 40 in the Y direction, which is the ratio between the tip of the drain electrode 40 (the portion farthest away from the second wiring 82) and the root portion of the drain electrode (the portion closest to the second wiring 82). As the ratio becomes larger, a larger number of the first structures 52 are provided in the drain electrode 40. As illustrated in FIG. 11B, it can be seen that as the ratio gets larger, the product of the on-resistance and the wiring area becomes smaller, that is, the figure of merit (FOM) improves.

As a method of reducing the area of the tip of the drain electrode 40, for example, it would be conceivable that the shape of the drain electrode 40 in the plane parallel to the substrate surface 2a could be formed in a triangular shape or the like so that a width of the drain electrode 40 in the Y direction becomes narrower toward the tip of the drain electrode 40. However, in this case, since the tip of the drain electrode 40 becomes an apex of the triangular shape, there is a problem that it becomes difficult to process the tip thereof. In order to avoid such processing difficulties, for example, it is conceivable that the shape of the drain electrode 40 in the plane parallel to the substrate surface 2a is formed in a combination of rectangles so that a length of a rectangular side in the Y direction becomes smaller toward the tip of the drain electrode 40. However, there is a problem that an electric field will be concentrated at a corner portion of the rectangle such that reliability deteriorates. On the other hand, in the case of the semiconductor device 100 of the first embodiment, processing is performed to form the first holes 56, the first side holes 58, and the second side holes 60. Processing difficulties for forming such holes are relatively low.

By allowing the source electrode 10 to have a structure similar to that of the drain electrode 40, better uniformity of the current in the semiconductor device 100 can be achieved.

It is generally desirable that the first structures 52 be aligned with one another in position on the drain electrode 40 portions. This is to prevent unintended non-uniformity of a current distribution in the semiconductor device 100 by causing the disposition of the first structures 52 along the Y direction to limit the shifting as much as possible caused by each drain electrode 40.

Similarly, it is generally desirable that the distance between the first structure 52b1 and the first structure 52b2 be equal to the distance between the fifth structure 22b1 and the fifth structure 22b2. Likewise, it is desirable that the distance between the first structure 52b2 and the first structure 52b3 be equal to the distance between the fifth structure 22b2 and the fifth structure 22b3. Likewise, it is desirable that the distance between the first structure 52b3 and the first structure 52b4 be equal to the distance between the fifth structure 22b3 and the fifth structure 22b4. And so forth, for each adjacent pair of first structures 52 and correspond pairs of fifth structures 52. This arrangement helps to prevent an unintended non-uniformity of the current distribution in the semiconductor device 100 by aligning the disposition of the first structure 52 of the drain electrode 40 and the disposition of the fifth structure 22 of the source electrode 10.

The semiconductor device 100 of the first embodiment is particularly desirably applied when the substrate 2 is a silicon substrate. Since the silicon substrate has a higher electrical conductivity than that of the sapphire substrate, the output capacitance $c_{oss}$ generated between the substrate 2 and the drain electrode 40 is likely to occur such that the switching loss will be high.

With the semiconductor device of the first embodiment, it is possible to provide a semiconductor device having a reduced output capacitance.

Second Embodiment

The description of the content that overlaps with the first embodiment will be omitted.

Figure 12A:
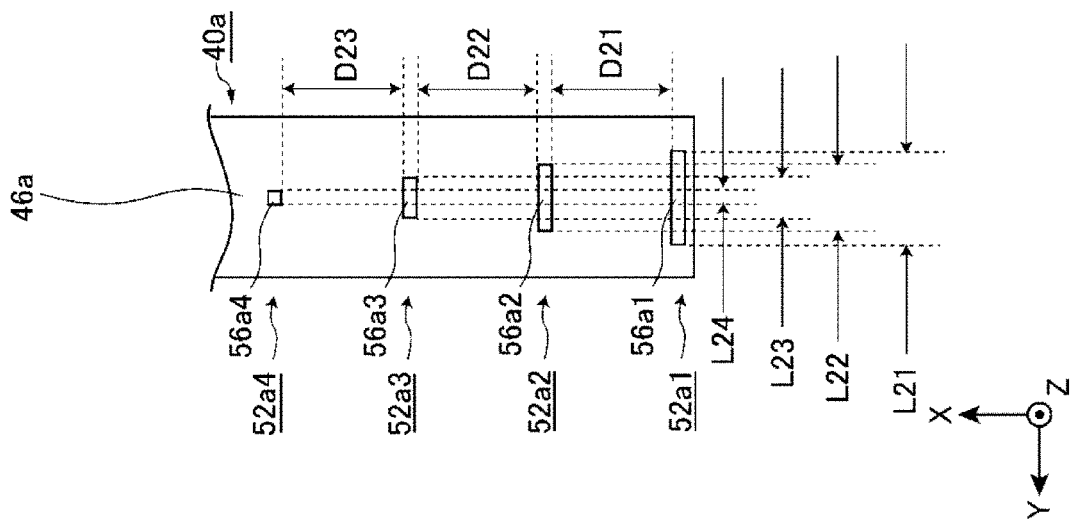
FIGS. 12A and 12B are schematic top views of a semiconductor device of a second embodiment.
Figure 12B:
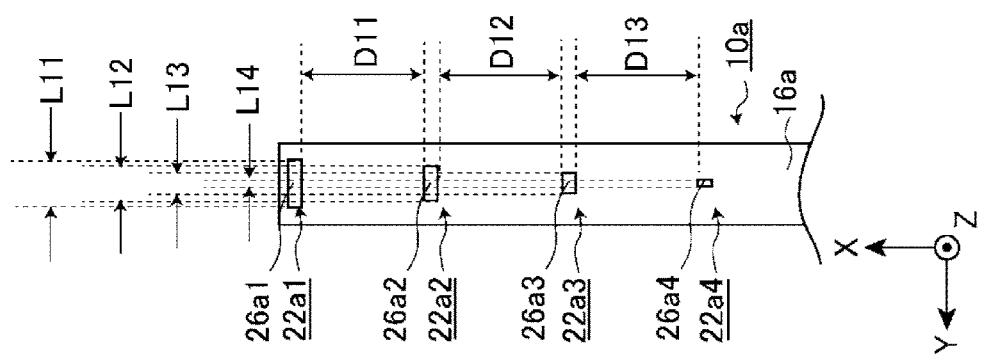

FIGS. 12A and 12B are schematic top views of the semiconductor device 100 of the second embodiment. FIG. 12A is a schematic top view of the source electrode 10a. In the second embodiment, a length L11 of a fourth hole 26a1 of a fifth structure 22a1 in the Y direction is greater than a length L12 of a fourth hole 26a2 of a fifth structure 22a2 in the Y direction. The length L12 of the fourth hole 26a2 of the fifth structure 22a2 in the Y direction is greater than a length L13 of a fourth hole 26a3 of a fifth structure 22a3 in the Y direction. The length L13 of the fourth hole 26a3 of the fifth structure 22a3 in the Y direction is greater than a length L14 of a fourth hole 26a4 of a fifth structure 22a4 in the Y direction. However, unlike the first embodiment, in the second embodiment, the spacing in the X direction between adjacent holes is equal for each pair. That is, a distance D11 between the fourth hole 26a1 and the fourth hole 26a2, a distance D12 between the fourth hole 26a2 and the fourth hole 26a3, and a distance D13 between the fourth hole 26a3 and the fourth hole 26a4 are equal to each other.

FIG. 12B is a schematic top view of the drain electrode 40a. In the second embodiment, a length L21 of a first hole 56a1 of the first structure 52a1 in the Y direction is greater than a length L22 of a first hole 56a2 of the first structure 52a2 in the Y direction. The length L22 of the first hole 56a2 of the first structure 52a2 in the Y direction is greater than a length L23 of a first hole 56a3 of the first structure 52a3 in the Y direction. The length L23 of the first hole 56a3 of the first structure 52a3 in the Y direction is greater than a length L24 of a first hole 56a4 of the first structure 52a4 in the Y direction. Similar to the fifth structures 22 in FIG. 12A, a distance D21 between the first hole 56a1 and the first hole 56a2, a distance D22 between the first hole 56a2 and the first hole 56a3, and a distance D23 between the first hole 56a3 and the first hole 56a4 are equal to each other.

As a result, since an electrode area at the tip of the drain electrode can still be reduced, it is possible to provide a semiconductor device having a smaller output capacitance. By giving the source electrode 10 the same general structure as that of the drain electrode, better uniformity of the current in the semiconductor device can be achieved.

The semiconductor device of the second embodiment also makes it possible to provide a semiconductor device having a reduced output capacitance like the first embodiment.

Third Embodiment

A semiconductor device of a third embodiment is different from the semiconductor device of the second embodiment in that the length of the first holes 26 in the second direction gets longer the nearer the tip end of the source electrode 10, and, similarly, the length of the holes 56 in the second direction gets longer the nearer the tip end of the drain electrode 40.

FIGS. 13A and 13B are schematic top views of the semiconductor device 100 of the third embodiment. FIG. 13A is a schematic top view of the source electrode 10a. A length L31 of the second hole 26a1 of the fifth structure 22a1 in the X direction is longer than a length L32 of the second hole 26a2 of the fifth structure 22a2 in the X direction. The length L32 of the second hole 26a2 of the fifth structure 22a2 in the X direction is longer than a length L33 of the second hole 26a3 of the fifth structure 22a3 in the X direction. The length L33 of the second hole 26a3 of the fifth structure 22a3 in the X direction is longer than a length L34 of the second hole 26a4 of the fifth structure 22a4 in the X direction. The length L34 of the second hole 26a4 of the fifth structure 22a4 in the X direction is longer than a length L35 of a second hole 26a5 of a fifth structure 22a5 in the X direction.

Lengths in the Y direction of the second hole 26a1, the second hole 26a2, the second hole 26a3, the second hole 26a4, and the second hole 26a5 are each a length L36, and thus are equal to each other.

FIG. 13B is a schematic top view of the drain electrode 40a. A length L41 of the first hole 56a1 of the first structure 52a1 in the X direction is longer than a length L42 of the first hole 56a2 of the first structure 52a2 in the X direction. The length L42 of the first hole 56a2 of the first structure 52a2 in the X direction is longer than a length L43 of the first hole 56a3 of the first structure 52a3 in the X direction. The length L43 of the first hole 56a3 of the first structure 52a3 in the X direction is longer than a length L44 of the first hole 56a4 of the first structure 52a4 in the X direction. The length L44 of the first hole 56a4 of the first structure 52a4 in the X direction is longer than a length L45 of a first hole 56a5 of a first structure 52a5 in the X direction.

On the other hand, lengths in the Y direction of the first hole 56a1, the first hole 56a2, the first hole 56a3, the first hole 56a4, and the first hole 56a5 are each length L46, and are thus equal to each other.

As a result, since the electrode area at the tip of the drain electrode 40 can still be reduced, it is possible to provide a semiconductor device having a smaller output capacitance. By giving the source electrode 10 a similar structure as that of the drain electrode 40, better uniformity of the current in the semiconductor device can be achieved.

The semiconductor device of the third embodiment also makes it possible to provide a semiconductor device having a small output capacitance.

APPENDIX

A semiconductor device of an embodiment includes: a substrate; a first nitride semiconductor layer provided on the substrate; a second nitride semiconductor layer provided on the first nitride semiconductor layer and having a larger band gap than that of the first nitride semiconductor layer; a first wiring provided on the second nitride semiconductor layer and extending in a first direction parallel to a substrate surface of the substrate; a first source electrode provided on the second nitride semiconductor layer, electrically connected to the first wiring, and extending in a second direction parallel to the substrate surface and intersecting the first direction; a first gate electrode provided on the second nitride semiconductor layer and extending in the second direction; and a first drain electrode including a first drain wiring provided on the second nitride semiconductor layer and extending in the second direction, a second drain wiring provided on the second nitride semiconductor layer and extending in the second direction, a first element isolation region provided in the second nitride semiconductor layer below between the first drain wiring and the second drain wiring, and a third drain wiring provided on the first drain wiring and the second drain wiring and extending in the second direction. A first plurality of holes including a first hole, a second hole farther away from a tip of the third drain wiring than the first hole, and a third hole farther away from the tip of the third drain wiring than the second hole are provided in the third drain wiring, and a first distance between the first hole and the second hole is shorter than a second distance between the second hole and the third hole.

In the semiconductor device of an embodiment, the first source electrode can include: a first source wiring extending in the second direction; a second source wiring extending in the second direction; a second element isolation region provided in the second nitride semiconductor layer below between the first source wiring and the second source wiring; and a third source wiring provided on the first source wiring and the second source wiring and extending in the second direction. A second plurality of holes including a fourth hole, a fifth hole farther away from a tip of the third source wiring than the fourth hole, a sixth hole farther away from the tip of the third source wiring than the fifth hole are provided in the third source wiring, and a third distance between the fourth hole and the fifth hole is shorter than a fourth distance between the fifth hole and the sixth hole.

Next, in the semiconductor device of an embodiment, the first distance and the third distance can be equal to each other, and the second distance and the fourth distance can be equal to each other.

The semiconductor device of an embodiment may further include: a second drain electrode including a fourth drain wiring provided on the second nitride semiconductor layer and extending in the second direction; a fifth drain wiring provided on the second nitride semiconductor layer and extending in the second direction; a third element isolation region provided in the second nitride semiconductor layer below between the fourth drain wiring and the fifth drain wiring; and a sixth drain wiring provided on the fourth drain wiring and the fifth drain wiring and extending in the second direction. A third plurality of holes including a seventh hole, an eighth hole farther away from the tip of the third drain wiring than the seventh hole, and a ninth hole farther away from the tip of the third drain wiring than the eighth hole are provided in the sixth drain wiring. A fifth distance between the seventh hole and the eighth hole is shorter than a sixth distance between the eighth hole and the ninth hole.

A semiconductor device of an embodiment includes: a substrate; a first nitride semiconductor layer provided on the substrate; a second nitride semiconductor layer provided on the first nitride semiconductor layer and having a larger band gap than that of the first nitride semiconductor layer; a first wiring provided on the second nitride semiconductor layer and extending in a first direction parallel to a substrate surface of the substrate; a second wiring provided separately from the first wiring and extending in the first direction on the second nitride semiconductor layer; a first source electrode provided on the second nitride semiconductor layer, electrically connected to the first wiring, and extending in a second direction parallel to the substrate surface and intersecting the first direction; a second source electrode provided on the second nitride semiconductor layer, electrically connected to the first wiring, and extending in the second direction; a first gate electrode provided on the second nitride semiconductor layer between the first source electrode and the second source electrode and extending in the second direction; a second gate electrode provided on the second nitride semiconductor layer between the second source electrode and the first gate electrode and extending in the second direction; and a first drain electrode including a first drain wiring provided on the second nitride semiconductor layer between the first gate electrode and the second gate electrode and extending in the second direction, a second drain wiring provided between the second gate electrode and the first drain wiring and extending in the second direction, a first element isolation region provided in the second nitride semiconductor layer below between the first drain wiring and the second drain wiring, a third drain wiring provided on the first drain wiring and the second drain wiring and extending in the second direction, a fourth drain wiring provided between the first drain wiring and the third drain wiring, extending in the second direction, and electrically connecting the first drain wiring and the third drain wiring, a fifth drain wiring provided between the second drain wiring and the third drain wiring, extending in the second direction, and electrically connecting the second drain wiring and the third drain wiring, and a plurality of first structures, and electrically connected to the second wiring. Each of the plurality of first structures includes: a first hole that penetrates the third drain wiring in a third direction intersecting the first and second directions and that is aligned on a first virtual straight line parallel to the third direction; a second hole that penetrates the fourth drain wiring in the first direction and that is aligned on a second virtual straight line parallel to the first direction, in which the second virtual straight line is aligned on the first virtual straight line; and a third hole that penetrates the fifth drain wiring in the first direction and that is aligned on the second virtual straight line. The plurality of first structures include: a second structure; a third structure provided between the second structure and the second wiring; and a fourth structure provided between the second structure and the third structure, in which a second distance to the third structure is longer than a first distance to the second structure.

In the semiconductor device of an embodiment, the first source electrode may include: a first source wiring extending in the second direction; a second source wiring provided between the first gate electrode and the first source wiring and extending in the second direction; a second element isolation region provided in the second nitride semiconductor layer below between the first source wiring and the second source wiring; a third source wiring provided on the first source wiring and the second source wiring and extending in the second direction; a fourth source wiring provided between the first source wiring and the third source wiring, extending in the second direction, and electrically connecting the first source wiring and the third source wiring; a fifth source wiring provided between the second source wiring and the third source wiring, extending in the second direction, and electrically connecting the second source wiring and the third source wiring; and a plurality of fifth structures. Each of the plurality of fifth structures includes: a fourth hole that penetrates the third source wiring in the third direction and that is aligned on a third virtual straight line parallel to the third direction; a fifth hole that penetrates the fourth source wiring in the first direction and that is aligned on a fourth virtual straight line parallel to the first direction, in which the fourth virtual straight line is aligned on the third virtual straight line; and a sixth hole that penetrates the fifth source wiring in the first direction and that is aligned on the fourth virtual straight line. The plurality of fifth structures include: a sixth structure; a seventh structure provided between the sixth structure and the first wiring; and an eighth structure provided between the sixth structure and the seventh structure, in which a fourth distance to the seventh structure is longer than a third distance to the sixth structure.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first nitride semiconductor layer on a substrate;
a second nitride semiconductor layer on the first nitride semiconductor layer and having a band gap larger than that of the first nitride semiconductor layer;
a first wiring on the second nitride semiconductor layer and extending in a first direction;
a first source electrode on the second nitride semiconductor layer, electrically connected to the first wiring, and extending in a second direction intersecting the first direction;
a first drain electrode extending in the second direction and including:
a first drain wiring extending in the second direction on the second nitride semiconductor layer,
a second drain wiring extending in the second direction on the second nitride semiconductor layer, spaced from the first drain wiring in the first direction,
a first element isolation region in the second nitride semiconductor layer between positions of the first drain wiring and the second drain wiring, and
a third drain wiring extending in the second direction on the first drain wiring and the second drain wiring; and
a first gate electrode extending in the second direction on the second nitride semiconductor layer between the first source electrode and the first drain electrode in the first direction, wherein
the third drain wiring includes a plurality of holes therein aligned with each other along the second direction with spacing between adjacent holes in the second direction increasing with increasing distance in the second direction from the first wiring.

2. The semiconductor device according to claim 1, wherein the first source electrode comprises:
a first source wiring extending in the second direction;
a second source wiring spaced from the first source wiring in the first direction and extending in the second direction;
a second element isolation region in the second nitride semiconductor layer between positions of the first source wiring and the second source wiring; and
a third source wiring extending in the second direction on the first source wiring and the second source wiring, wherein
the third source wiring includes a plurality of holes therein aligned with each other along the second direction with spacing between adjacent holes in the second direction decreasing with increasing distance in the second direction from the first wiring.

3. The semiconductor device according to claim 2, wherein the distance between a pair of adjacent holes at an end portion of the third drain wiring is equal to the distance between a pair of adjacent holes at end portion of the third source wiring.

4. The semiconductor device according to claim 2, further comprising:
a second drain electrode spaced from the first drain electrode in the first direction and including:
a fourth drain wiring on the second nitride semiconductor layer and extending in the second direction;
a fifth drain wiring spaced from the fourth drain wiring in the first direction on the second nitride semiconductor layer and extending in the second direction;
a third element isolation region in the second nitride semiconductor layer between positions of the fourth drain wiring and the fifth drain wiring; and
a sixth drain wiring extending in the second direction on the fourth drain wiring and the fifth drain wiring and, wherein
the sixth drain wiring includes a plurality of holes therein aligned with each other along the second direction with spacing between adjacent holes in the second direction decreasing with increasing distance in the second direction from the first wiring.

5. The semiconductor device according to claim 2, wherein
a first hole extends through the first source wiring in the first direction at a position along the second direction matching a position of one of the plurality of holes in the third source wiring, and
a second hole extends through the second source wiring in the first direction at the position along the second direction matching the position of the one of the plurality of holes in the third source wiring.

6. The semiconductor device according to claim 2, wherein
a first hole extends through the first drain wiring in the first direction at a position along the second direction matching a position of one of the plurality of holes in the third drain wiring, and
a second hole extends through the second drain wiring in the first direction at the position along the second direction matching the position of the one of the plurality of holes in the third drain wiring.

7. The semiconductor device according to claim 6, wherein
a third hole extends through the first source wiring in the first direction at a position along the second direction matching a position of one of the plurality of holes in the third source wiring, and
a fourth hole extends through the second source wiring in the first direction at the position along the second direction matching the position of the one of the plurality of holes in the third source wiring.

8. The semiconductor device according to claim 1, wherein
a first hole extends through the first drain wiring in the first direction at a position along the second direction matching a position of one of the plurality of holes in the third drain wiring, and
a second hole extends through the second drain wiring in the first direction at the position along the second direction matching the position of the one of the plurality of holes in the third drain wiring.

9. The semiconductor device according to claim 1, wherein the first gate electrode extends into the second nitride semiconductor layer.

10. The semiconductor device according to claim 1, wherein the substrate is a silicon substrate.

11. The semiconductor device according to claim 1, wherein each of the holes in the plurality of holes in the third drain wiring is the same dimension in the first direction as each other hole in the plurality of holes, and each of the holes in the plurality of holes in the third drain wiring is the same dimension in the second direction as each other hole in the plurality of holes.

12. A semiconductor device, comprising:
a first nitride semiconductor layer on a substrate;
a second nitride semiconductor layer on the first nitride semiconductor layer and having a band gap larger than that of the first nitride semiconductor layer;
a first wiring on the second nitride semiconductor layer and extending in a first direction;
a first source electrode on the second nitride semiconductor layer, electrically connected to the first wiring, and extending in a second direction intersecting the first direction;
a first drain electrode extending in the second direction and including:
    a first drain wiring extending in the second direction on the second nitride semiconductor layer,
    a second drain wiring extending in the second direction on the second nitride semiconductor layer, spaced from the first drain wiring in the first direction,
    a first element isolation region in the second nitride semiconductor layer between positions of the first drain wiring and the second drain wiring, and
    a third drain wiring extending in the second direction on the first drain wiring and the second drain wiring; and
a first gate electrode extending in the second direction on the second nitride semiconductor layer between the first source electrode and the first drain electrode in the first direction, wherein
the third drain wiring includes a plurality of holes therein aligned with each other along the second direction with spacing between adjacent holes in the second direction being the same for each pair of adjacent holes,
the plurality of holes includes a first hole at a first distance from the first wiring and a second hole at a second distance from the first wiring,
the first distance is less than the second distance, and
a width of the first hole in the first direction is greater than a width of the second hole in the first direction.

13. The semiconductor device according to claim 12, wherein
the plurality of holes includes a third hole at a third distance from the first wiring, the third distance being greater than the first distance, but less than the second distance, and
a width of the third hole in the first direction is greater than the width of the second hole in the first direction, but less than the width of the first hole in the first direction.

14. The semiconductor device according to claim 12, wherein the first source electrode comprises:
a first source wiring extending in the second direction;
a second source wiring spaced from the first source wiring in the first direction and extending in the second direction;
a second element isolation region in the second nitride semiconductor layer between positions of the first source wiring and the second source wiring; and
a third source wiring extending in the second direction on the first source wiring and the second source wiring, wherein the third source wiring includes a plurality of holes therein aligned with each other along the second direction with spacing between adjacent holes in the second direction being the same for each pair of adjacent holes.

15. The semiconductor device according to claim 14, wherein
a third hole extends through the first drain wiring in the first direction at a position along the second direction matching a position of one of the plurality of holes in the third drain wiring, and
a fourth hole extends through the second drain wiring in the first direction at the position along the second direction matching the position of the one of the plurality of holes in the third drain wiring.

16. The semiconductor device according to claim 15, wherein
a fifth hole extends through the first source wiring in the first direction at a position along the second direction matching a position of one of the plurality of holes in the third source wiring, and
a sixth hole extends through the second source wiring in the first direction at the position along the second direction matching the position of the one of the plurality of holes in the third source wiring.

17. A semiconductor device, comprising:
a first nitride semiconductor layer on a substrate;
a second nitride semiconductor layer on the first nitride semiconductor layer and having a band gap larger than that of the first nitride semiconductor layer;
a first wiring on the second nitride semiconductor layer and extending in a first direction;
a first source electrode on the second nitride semiconductor layer, electrically connected to the first wiring, and extending in a second direction intersecting the first direction;
a first drain electrode extending in the second direction and including:
    a first drain wiring extending in the second direction on the second nitride semiconductor layer,
    a second drain wiring extending in the second direction on the second nitride semiconductor layer, spaced from the first drain wiring in the first direction,
    a first element isolation region in the second nitride semiconductor layer between positions of the first drain wiring and the second drain wiring, and
    a third drain wiring extending in the second direction on the first drain wiring and the second drain wiring; and
a first gate electrode extending in the second direction on the second nitride semiconductor layer between the first source electrode and the first drain electrode in the first direction, wherein
the third drain wiring includes a plurality of holes therein aligned with each other along the second direction with spacing between adjacent holes in the second direction being the same for each pair of adjacent holes,
the plurality of holes includes a first hole at a first distance from the first wiring and a second hole at a second distance from the first wiring,
the first distance is less than the second distance, and
a length of the first hole in the second direction is greater than a length of the second hole in the second direction.

18. The semiconductor device according to claim 17, wherein the plurality of holes includes a third hole at a third distance from the first wiring, the third distance being greater than the first distance, but less than the second distance, and a length of the third hole in the second direction is greater than the length of the second hole in the second direction, but less than the length of the first hole in the second direction.

19. The semiconductor device according to claim 17, wherein the first source electrode comprises:

a first source wiring extending in the second direction;

a second source wiring spaced from the first source wiring in the first direction and extending in the second direction;

a second element isolation region in the second nitride semiconductor layer between positions of the first source wiring and the second source wiring; and a third source wiring extending in the second direction on the first source wiring and the second source wiring, wherein the third source wiring includes a plurality of holes therein aligned with each other along the second direction with spacing between adjacent holes in the second direction being the same for each pair of adjacent holes.

20. The semiconductor device according to claim 17, wherein a width of the first hole in the first direction is equal to a length of the second hole in the first direction.

* * * * *